United States Patent [19]
Whittle et al.

[11] Patent Number: 5,476,134
[45] Date of Patent: Dec. 19, 1995

[54] CRN COATED DIE-CASTING TOOLS FOR CASTING LOW ALUMINUM IRON ALLOYS AND METHOD OF MAKING SAME

[75] Inventors: Neville Whittle, Murrysville; Joseph P. Harenski, Export; Norman J. Panseri, Irwin, all of Pa.

[73] Assignee: Aluminum Company of America, Pittsburgh, Pa.

[21] Appl. No.: 171,564

[22] Filed: Dec. 21, 1993

[51] Int. Cl.$^6$ ........................................ B22C 3/00
[52] U.S. Cl. .......................... 164/138; 164/312; 164/113
[58] Field of Search ........................ 164/72, 306, 309, 164/312, 113, 119, 138; 249/135

[56] References Cited

U.S. PATENT DOCUMENTS

| | | | |
|---|---|---|---|
| 4,511,593 | 4/1985 | Brandolf | 427/37 |
| 4,673,477 | 6/1987 | Ramalingam et al. | 204/192.38 |
| 4,999,259 | 3/1991 | Hashimoto et al. | 428/685 |
| 5,092,558 | 3/1992 | Katsura | 249/114.1 |
| 5,234,561 | 8/1993 | Randhawa | 204/192.38 |
| 5,316,321 | 5/1994 | Ishida et al. | 277/235 A |
| 5,318,091 | 6/1994 | Pavoni et al. | 164/6 |
| 5,325,747 | 7/1994 | Santhanam et al. | 82/1.11 |
| 5,346,600 | 9/1994 | Nieh et al. | 204/192.3 |

FOREIGN PATENT DOCUMENTS

| | | |
|---|---|---|
| 55-041298 | 3/1980 | Japan . |
| 56-53843 | 5/1981 | Japan . |
| 56-111560 | 9/1981 | Japan . |

OTHER PUBLICATIONS

Extension To Service Life Of Dies For Aluminum Die Casting; by Masahiko Hihara, Yamanashi Industrial Technological College, Kinzoku; vol. 58, No. 8 34–41 (1988).
Compositional, Microstructural And Morphological Effects On The Mechanical And Tribological Properties Of Chromium Nitrogen Films; by S. J. Bull et al.; presented at 17th conference on Metallurgical coatings, San Diego, Calif. on Apr. 2–6, 1990; pp. 11–22.
Hard Coatings By PVD Methods; by A. Matthews, et al.; Published under the auspices of The Short Course Executive Committee American Vacuum Society; pp. 1–76.
Technical Note: A Review Of Cathodic Arc Plasma Deposition Process And Their Applications; by H. Randhawa et al.; Surface and Coatings Technology, 37 (1987) pp. 303–318.

Primary Examiner—P. Austin Bradley
Assistant Examiner—Randolph S. Herrick
Attorney, Agent, or Firm—Richard V. Westerhoff; Thomas R. Trempus

[57] ABSTRACT

Steel tooling for die-casting low iron content aluminum alloys is surface treated with a layer of CrN applied to a thickness of at least 4 microns, and preferably 5–10 microns, by physical vapor deposition (PVD), and preferably a steered arc evaporation PVD process. The CrN protects the steel tooling from dissolution and erosion by the highly active molten aluminum.

19 Claims, No Drawings

CRN COATED DIE-CASTING TOOLS FOR CASTING LOW ALUMINUM IRON ALLOYS AND METHOD OF MAKING SAME

BACKGROUND INFORMATION

1. Field of the Invention

This invention relates to tools used in die-casting aluminum alloys and a method of making such tools which can include the dies, the fill chamber or shot sleeve, and other components of the apparatus and particularly those exposed to the molten aluminum. It is directed to such tools, and a method of making such tools, with a single or multi-layer coating comprising a material which resists dissolution and erosion by molten aluminum alloys, particularly low iron aluminum alloys.

2. Background Information

Tooling for die-casting molten aluminum is commonly fabricated from tool steel, such as H13 alloy steel. As molten aluminum is highly reactive, the surface of the H13 steel tooling is generally treated to resist the dissolution and erosion of the steel. Typically, the steel tool is nitrided such as by ion (plasma), salt bath, or gas treatment. This nitride treatment is adequate for protecting the steel tooling from aluminum alloys which typically contain 0.6% by weight or more of iron. There is interest, however, in reducing the iron content of some aluminum alloys below 0.6% and preferably below 0.3% by weight to improve ductility, strength and treatability of the casting. This reduction in iron content of the aluminum alloy increases its reactivity with the steel tooling resulting in increased dissolution, soldering, and erosion, particularly in areas exposed to molten aluminum at high velocities. This dissolution and erosive wear limits the life of the die-casting tooling when it occurs in a critical area.

It has been suggested in Japanese Kokai patent announcement 56–111560, dated Sep. 3, 1981, that copper die-casting tooling can be protected from aluminum by coating the tooling with silicon carbide which has low wettability with aluminum. As the silicon carbide and copper have substantially different coefficients of thermal expansion, a base layer of titanium nitride or titanium carbide, which have coefficients of thermal expansion intermediate to those of copper and silicon carbide, is applied to the copper tooling first. The silicon carbide, and titanium carbide or nitride are applied by a physical vapor deposition process rather than a chemical vapor deposition process, as the latter requires a reaction temperature that would significantly soften or even melt copper.

It has also been suggested in Japanese patent publication 55–41298 that dies for casting high melting point metals such as iron, can be made resistant to corrosion by using tungsten or molybdenum alloys as the base material, and coating the base material with at least one species of titanium nitride, titanium carbide, alumina, zirconia and silicon nitride deposited by chemical vapor deposition. The tungsten and molybdenum alloys can withstand the high temperature, about 1000° C. required for conventional chemical vapor deposition, without significantly changing their mechanical properties. However, as mentioned above, such high reaction temperatures would soften/distort copper dies. They also would distort steel dies and seriously affect their mechanical properties.

At least one investigator has considered coating steel dies for casting aluminum with CrN and TiN by physical vapor deposition or with TiN, TiC, Ti(CN), Ti(CN)—TiN, TiC—Ti(CN)—TiN, or W2C by chemical vapor deposition as reported in an article entitled: "Extension to Service Life of Dies for Aluminum Die-Casting; by Masahiko Hihara, Yamanashi Industrial Technological College, Kinzoku; Vol. 58, No. 8 34–41 (1988). The CrN coating applied by a physical vapor deposition process was considered unsatisfactory as the coating exfoliated and was not much better than the bare steel in resisting corrosion by the molten aluminum. It appears that the CrN coating was about 3 microns thick.

OBJECTS OF THE INVENTION

We believe that the ineffectiveness of nitride diffusion treatments in protecting steel die-casting tools from low iron content (less than about 0.6% by weight) aluminum alloys is due to defects in the nitride diffusion treatments such as cracks, thin spots, and pin holes. These defects allow the molten aluminum to penetrate and attack the underlying steel substrate.

We also believe that there are several reasons for the lack of success in protecting steel dies from attack from molten aluminum by coating with CrN by physical vapor deposition. Firstly, the adhesion of the coating to the steel must be sufficient to resist thermal shock loading when the coating comes into contact with the molten metal. Further, when the coating is thin, such as three microns, defects in the coating such as pin holes and cracks can penetrate to the substrate, allowing the molten aluminum to preferentially react with the less resistant steel. The aluminum/steel reaction occurs very quickly, particularly with low iron aluminum alloys, and proceeds out from the coating defect underneath the coating. The reaction products thus formed generally have a greater volume than the steel, with the consequence that the coating is locally "pushed" up and off the steel exposing more of the steel substrate. It is clear that this effect can "snowball" until the dissolution rate of CrN coated steel equals that of the steel. The performance then of a CrN coated steel is predominantly a function of the number and distribution of the defects in the CrN coating.

There is a need, therefore, for improved tooling for die-casting aluminum, and especially low iron content aluminum alloys, and for the associated method of making such tooling which has an extended life.

It is, therefore, a primary object of the invention to provide improved tooling and a method of making such tooling for die-casting, and especially die- casting low iron aluminum alloys.

More particularly, it is an object of the invention to provide an improved die-casting tool, method of making the same, which is resistant to dissolution and erosion by low iron content aluminum alloys.

It is also an object of the invention to provide a precision die-casting tool with mechanical properties that are not adversely affected by the application of a coating that is resistant to low iron aluminum alloys.

It is a further object of the invention to provide a die-casting tool which requires a single or a multi-layer of protective material(s) to resist molten aluminum and in particular low iron content alloys.

SUMMARY OF THE INVENTION

These objects and needs and others are satisfied by the invention which is directed to die-casting Tooling which is resistant to molten aluminum, and especially low iron content molten aluminum alloys, and a method of making the same.

One aspect of the invention is directed to tooling for die-casting aluminum and low iron content aluminum alloys comprising a steel substrate having a desired tool surface configuration and a surface coating comprising CrN deposited on the desired surface configuration of the substrate, the coating having a thickness and thermal shock resistance which avoids defects in the coating through which the aluminum or aluminum alloy could attack the steel substrate. Preferably, the CrN coating is deposited on the tooling by physical vapor deposition.

We have found that the presence of elemental or partially reacted chromium in the coating, as may be the case with arc deposited coatings, is detrimental to the dissolution resistance of the coated tooling. The elemental or partially reacted chromium is readily dissolved by the molten aluminum or aluminum alloy thereby creating local defects in the coating through which the molten metal can access and attack the underlying steel substrate. In accordance with the invention, the coating is essentially CrN with a minimum presence of elemental or partially reacted chromium. It is another aspect of the invention that the thickness of the coating be sufficient that the aforementioned defects in the coating do not form a continuous path to the substrate for the molten metal. We have found that a minimum thickness of about 4 to 5 microns, and preferably 5 to 10 microns is satisfactory for this purpose.

Another aspect of the invention is the process by which the unique tooling is made. An important first step is to insure that the steel substrate is clean to promote good adhesion of tile coating to the substrate. While any of the known methods of chemical cleaning, plasma cleaning and arc cleaning could be used, we have found that the best results are achieved by using all three cleaning processes in this order.

The CrN coating is applied to the cleaned surface of the substrate by a physical vapor deposition (PVD) process. While other PVD processes such as evaporation, sputtering and ion plating can be utilized, in the present study are evaporation, and in particular steered arc evaporation, was used. In the are evaporation process, the material being evaporated, in this case chromium, forms the cathode on which is struck an arc which volatilizes and ionizes the chromium. In the steered arc process, a magnetic field is used to move the are in a controlled pattern over the target material. The ionized and neutral material from the target is deposited onto the tooling to which a bias voltage may be applied. Nitrogen gas introduced into the vacuum chamber combines with the chromium ions to form CrN which is deposited onto the tooling. The various parameters of the steered arc PVD process are controlled to achieve the desired coating properties. These parameters include the bias voltage applied to the object to be coated, the total pressure within the vacuum chamber and the inert gas (preferably argon) to nitrogen ratio in the vacuum chamber.

It has been mentioned that the desired coating should consist essentially of CrN with minimum amounts of Cr and partially reacted Cr. This is achieved by controlling the ratio of argon to nitrogen preferably to not more than 1. The total pressure in the system must also be selected judiciously. Higher pressures allow the coating of more complex parts. We have found that a pressure between about 3 and 30 mtorr, in combination with the other suggested parameter ranges, produces a good coating for this application. The bias voltage should be relatively low, no greater than about −200 volts for the above pressures, and preferably in the range 0 to −200 volts. The ratio of argon to nitrogen should not be more than 1, and preferably zero.

DESCRIPTION OF THE PREFERRED EMBODIMENT

In accordance with the invention, steel tooling for die-casting aluminum, and especially aluminum alloys with an Fe content of less than 0.6% by weight, and preferably less than 0.3% by weight is surface treated with a coating of CrN which is applied by a PVD process. Preferably, the coating is applied by a steered are evaporation process using, for example, the apparatus disclosed in U.S. Pat. No. 4,673,477 which is hereby incorporated by reference.

Prior to application of the coating, the steel tooling which has the desired surface configuration is cleaned to remove oils and other surface contamination. Any known cleaning method may be used. In the preferred embodiment of the invention, three successive cleaning steps are utilized. First, the tooling is chemically cleaned such as with acetone followed by methanol. The tooling is then further cleaned by glow discharge followed by arc cleaning which sputters off the surface of the tooling. Advantageously, the latter two cleaning steps can be carried out in the apparatus in the described U.S. Pat. No. 4,673,477 which is also used to apply the coating to the cleaned tooling. The apparatus includes an enclosed chamber within which is mounted a cathode. In this case, the cathode is a plate of chromium. The tooling is mounted in the chamber to be either rotated in front of the cathode on a rotating table, or simply facing the cathode. The chamber is evacuated and an arc is struck between an anode and the chromium target. The arc impinges on the chromium target to create a cathode spot which vaporizes and ionizes the chromium.

For the glow discharge cleaning step, the vacuum chamber is charged with an inert gas such as argon to a pressure of 50 mtorr. A bias voltage of −1000 volts is applied to the tooling which initiates an abnormal glow discharge. The impingement of argon ions from this glow discharge onto the tooling cleans the surface to be coated. The final arc cleaning step is effected by decreasing the pressure to ~1 mtorr and igniting the arc. The bias voltage on the tooling is kept at −1000 volts. The chromium ions from the target bombard the surface of the tooling and sputter clean the surface.

When the surface of the tooling is thoroughly cleaned, the bias voltage on the tooling is reduced to the operating level for deposition of the coating. If the atmosphere in the vacuum chamber were to remain pure argon, a layer of Cr would be deposited onto the tooling. As previously discussed, this is highly undesirable as Cr is readily dissolved by molten aluminum. Accordingly, in accordance with the invention, nitrogen is introduced into the vacuum chamber. The nitrogen reacts with the chromium ions to form CrN which is deposited on the tooling. The total pressure in the vacuum chamber is made high enough to effect coating of tooling with complex surface configurations. Still, however, the ratio of argon to nitrogen, in effect the partial pressure of nitrogen, must be maintained at a level to minimize the deposition of Cr, partially reacted Cr, and possibly $Cr_2N$. Preferably the ratio of argon to nitrogen is less than 1. Deposition in nitrogen alone is preferred.

The bias voltage applied to the tooling affects the deposition rate, structure and adhesion of the coating. In arc evaporation, the adhesion of the coating to the substrate is promoted by intermixing of coating and substrate elements at the coating/substrate interface. The bias voltage during arc cleaning and deposition can effect this intermixing. At a bias voltage of −1000, material removal, i.e., cleaning, occurs. As the negative voltage is reduced, deposition begins to dominate over material removal. The transition is a function also of arc current and pressure. For an arc current of about 100 amperes and a pressure of 3 to 30 mtorrs, the bias voltage should be no more negative than about −200 volts, and preferably between about 0 and. −200 volts.

The CrN coating is applied to a thickness of at least 4 microns and preferably about 5 to 10 microns. Thicker coatings can be applied; however, satisfactory dissolution resistance can be achieved in the 5 to 10 micron range. At these coating thicknesses, and with the formation of unreacted and partially reacted Cr 5 minimized through the control of process parameters as discussed above, defects in the coating such as pinholes, cracks and macroparticles do not overlap to form a continuous path to the substrate for the molten aluminum to follow.

EXAMPLES

Sample rods were coated using the steered arc evaporation PVD process described above with varying values of bias voltage, pressure and argon to nitrogen ratio. H13 alloy steel rods, 0.5" dia ×10" long, were used as the sample tooling. Three values of bias voltage, 0, −100, and −200; four ratios of argon to nitrogen, 0, 1, 5, and 30; and two pressures, 3 and 30 mtorr, were selected. This generated 24 combinations of conditions. Two rods were used for each condition with results being averaged.

An attempt was made to standardize the coating thicknesses; however, as will be seen from the tabulated results below, this was difficult to do.

The sample tooling rods were cleaned prior to deposition of the coating using the three step cleaning process described above.

Following coating, the rods were subjected to a 90 minute rotating immersion test in molten C119 aluminum alloy (10% Si, 0.15% Mg, 0.3% Fe, bal. Al, all %'s by weight) at a temperature of about 1300° F. Each sample was weighed after coating and after the immersion test to determine the percentage weight loss as a measure of the resistance of the coating to dissolution in the molten aluminum. The results of these tests are tabulated in Table 1.

TABLE 1

| Condition, # | Ar: N2, Ratio | Pressure, mtorr | Bias Volts | Thickness, μ | Wt. loss, % |
|---|---|---|---|---|---|
| 1 | 0 | 3 | 0 | 3.9 | 0.44 |
| 2 | 0 | 3 | −100 | 5.6 | 0.09 |
| 3 | 0 | 3 | −200 | 5.0 | 0.07 |
| 4 | 0 | 30 | 0 | 5.1 | 0.20 |
| 5 | 0 | 30 | −100 | 4.7 | 0.30 |
| 6 | 0 | 30 | −200 | 4.7 | 0.11 |
| 7 | 1 | 3 | 0 | 4.1 | 0.78 |
| 8 | 1 | 3 | −100 | 4.2 | 0.46 |
| 9 | 1 | 3 | −200 | 4.3 | 1.72 |
| 10 | 1 | 30 | 0 | 4.7 | 0.16 |
| 11 | 1 | 30 | −100 | 4.9 | 0.14 |
| 12 | 1 | 30 | −200 | 5.5 | 0.15 |
| 13 | 5 | 3 | 0 | 4.5 | 58.20 |
| 14 | 5 | 3 | −100 | 4.7 | 51.00 |
| 15 | 5 | 3 | −200 | 4.1 | 60.40 |
| 16 | 5 | 30 | 0 | 4.4 | 0.33 |
| 17 | 5 | 30 | −100 | 4.5 | 2.73 |
| 18 | 5 | 30 | −200 | 4.9 | 2.66 |
| 19 | 30 | 3 | 0 | 4.3 | 54.50 |
| 20 | 30 | 3 | −100 | 4.2 | 63.00 |
| 21 | 30 | 3 | −200 | 4.2 | 47.30 |
| 22 | 30 | 30 | 0 | 4.2 | 62.00 |
| 23 | 30 | 30 | −100 | 4.2 | 52.70 |
| 24 | 30 | 30 | −200 | 3.6 | 53.50 |

After the ninety minute immersion, further testing to 180 minutes was carried out. The results of these tests are tabulated in Table 2.

TABLE 2

| Condition, # | Ar: N2, Ratio | Pressure, mtorr | Bias Volts | Thickness, μ | Wt. loss, % |
|---|---|---|---|---|---|
| 1 | 0 | 3 | 0 | 3.9 | 0.51 |
| 2 | 0 | 3 | −100 | 5.6 | 0.30 |
| 3 | 0 | 3 | −200 | 5.0 | 0.21 |
| 4 | 0 | 30 | 0 | 5.1 | 0.98 |
| 5 | 0 | 30 | −100 | 4.7 | 0.58 |
| 6 | 0 | 30 | −200 | 4.7 | 0.19 |
| 7 | 1 | 3 | 0 | 4.1 | 0.99 |
| 8 | 1 | 3 | −100 | 4.2 | 1.39 |
| 9 | 1 | 3 | −200 | 4.3 | 2.77 |
| 10 | 1 | 30 | 0 | 4.7 | 0.95 |
| 11 | 1 | 30 | −100 | 4.9 | 0.25 |
| 12 | 1 | 30 | −200 | 5.5 | 0.22 |
| 13 | 5 | 3 | 0 | 4.5 | F |
| 14 | 5 | 3 | −100 | 4.7 | F |
| 15 | 5 | 3 | −200 | 4.1 | F |
| 16 | 5 | 30 | 0 | 4.4 | 0.36 |
| 17 | 5 | 30 | −100 | 4.5 | 3.06 |
| 18 | 5 | 30 | −200 | 4.9 | 2.83 |
| 19 | 30 | 3 | 0 | 4.3 | F |
| 20 | 30 | 3 | −100 | 4.2 | F |
| 21 | 30 | 3 | −200 | 4.2 | F |
| 22 | 30 | 30 | 0 | 4.2 | F |
| 23 | 30 | 30 | −100 | 4.2 | F |
| 24 | 30 | 30 | −200 | 3.6 | F |

After the 180 minute immersion, further Testing to 240 minutes was carried out. The results of these tests are tabulated in Table 3.

TABLE 3

| Condition, # | Ar: N2, Ratio | Pressure, mtorr | Bias Volts | Thickness, μ | Wt. loss, % |
|---|---|---|---|---|---|
| 1 | 0 | 3 | 0 | 3.9 | 0.51 |
| 2 | 0 | 3 | −100 | 5.6 | 0.34 |
| 3 | 0 | 3 | −200 | 5.0 | 0.24 |
| 4 | 0 | 30 | 0 | 5.1 | 1.12 |
| 5 | 0 | 30 | −100 | 4.7 | 0.97 |
| 6 | 0 | 30 | −200 | 4.7 | 0.19 |
| 7 | 1 | 3 | 0 | 4.1 | 1.12 |
| 8 | 1 | 3 | −100 | 4.2 | 1.39 |
| 9 | 1 | 3 | −200 | 4.3 | 2.85 |
| 10 | 1 | 30 | 0 | 4.7 | 0.99 |
| 11 | 1 | 30 | −100 | 4.9 | 0.72 |
| 12 | 1 | 30 | −200 | 5.5 | 0.5 |
| 13 | 5 | 3 | 0 | 4.5 | F |
| 14 | 5 | 3 | −100 | 4.7 | F |
| 15 | 5 | 3 | −200 | 4.1 | F |
| 16 | 5 | 30 | 0 | 4.4 | 0.37 |
| 17 | 5 | 30 | −100 | 4.5 | 3.36 |
| 18 | 5 | 30 | −200 | 4.9 | 3.67 |
| 19 | 30 | 3 | 0 | 4.3 | F |
| 20 | 30 | 3 | −100 | 4.2 | F |
| 21 | 30 | 3 | −200 | 4.2 | F |
| 22 | 30 | 30 | 0 | 4.2 | F |
| 23 | 30 | 30 | −100 | 4.2 | F |

TABLE 3-continued

| Condition, # | Ar: N2, Ratio | Pressure, mtorr | Bias Volts | Thickness, μ | Wt. loss, % |
| --- | --- | --- | --- | --- | --- |
| 24 | 30 | 30 | −200 | 3.6 | F |

For those conditions in which the letter "F" appears in the Percent Weight Loss column of Tables 2 and 3, the rods coated under those conditions failed through complete coating removal and significant dissolution of the underlying H13 alloy substrate after 90 minutes of testing. Table 1 shows the significant weight losses for these samples after 90 minutes.

It is clear from Tables 1 and 2 that the argon to nitrogen ratio has the most significant effect on the performance of the coatings in this test. High argon to nitrogen ratios (>5) always result in poor performance except at high pressures. Both the bias and the pressure have less of an effect on performance than the argon to nitrogen ratio. Characterization of the above coatings by X-ray diffraction indicated that when CrN, rather than Cr, Cr with nitrogen in solution, or a sub-nitride such as $Cr_2N$, was formed, then performance was acceptable. Failure analysis of the above samples revealed that failure occurred through uniform dissolution of the coating in the case of Cr or Cr with nitrogen in solution, or through local coating inhomogeneities, such as cracks or unreacted or partially reacted Cr in the coating. These results are interpreted to mean that as long as there is an adequate supply of nitrogen to react with the chromium ions, i.e., the partial pressure of nitrogen is high enough, then CrN will form to protect the tool surface. While H13 alloy steel was used in the above tests, other tool steels, such as for example H11 alloy steel. In fact, the invention extends o the life of dies made with any steel that would be used for tools.

While the specific embodiments of the invention have been described in detail, it will be appreciated by those skilled in the art that various modifications and alternatives to those details could be developed in light of the overall teachings of the disclosure. Accordingly, the particular arrangements and conditions disclosed are meant to be illustrative only and not limiting as to scope of the invention which is to be given the full breadth of the appended claims and any and all equivalents.

What is claimed is:

1. A die-casting tool having a desired surface configuration suitable for die-casting aluminum and aluminum alloys with an iron content of less than about 0.6% by weight, said die-casting tool comprising:

a steel substrate having a desired tool surface configuration and a surface coating comprising a CrN deposit on the desired surface configuration of said substrate, the coating having a thickness of at least about four microns and thermal shock resistance which resists defects in the coating through which the aluminum or aluminum alloy attacks said steel substrate.

2. The die-casting tool of claim 1 wherein said coating of CrN is deposited by physical vapor deposition.

3. The die-casting tool of claim 2 wherein said CrN coating has a thickness between 5 and 10 microns.

4. The die-casting tool of claim 2 wherein said coating is applied by steered arc evaporation physical vapor deposition.

5. The die-casting tool of claim 4 wherein said CrN coating has a thickness of more than about 4 microns.

6. The die-casting tool of claim 5 wherein said CrN coating has a thickness of about 5 to 10 microns.

7. The die-casting tool of claim 6 wherein said steel substrate is selected from a group consisting of H11 alloy steel and H13 alloy steel.

8. The die-casting tool of claim 2 wherein said coating has a thickness of at least about 4 microns and consists essentially of CrN.

9. The method of coating steel tooling for die-casting aluminum and aluminum alloys with an iron content of less than about 0.6% iron, said method comprising the steps of:

cleaning said steel tooling, and applying a coating of CrN to a thickness of at least 4 microns using a physical vapor deposition process.

10. The method of claim 9 wherein said physical vapor deposition process is steered arc evaporation physical vapor deposition.

11. The method of claim 10 in which the steered arc evaporation physical vapor deposition includes applying a bias voltage of between 0 and −200 volts to the steel tooling in an atmosphere of one of nitrogen and a mixture of an inert gas and nitrogen in a ratio of not more than about 1, and at a pressure of between about 3 and 30 mtorr.

12. A method of claim 11 wherein said bias voltage is between −100 and −200 volts.

13. A method of claim 11 wherein said ratio of inert gas to nitrogen is about 0.

14. The method of claim 11 wherein said inert gas is argon.

15. The method of claim 11 wherein said pressure is about 30 mtorr.

16. The method of claim 11 wherein said bias voltage is between about −100 and −200, wherein said inert gas is argon and said ratio of argon to nitrogen is about 0, and wherein said pressure is about 30 mtorr.

17. The method of claim 10 wherein said step of cleaning includes plasma cleaning followed by arc cleaning using apparatus also used to apply said CrN coating to said tooling by steered arc evaporation physical vapor deposition.

18. The method of claim 9 wherein said coating consists essentially of CrN.

19. The method of claim 17 wherein said coating is applied to a thickness which provides thermal shock resistance and resists defects in the coating through which the aluminum or aluminum alloys attacks said steel substrate.

* * * * *